United States Patent
Nishimura et al.

(10) Patent No.: US 6,371,713 B1
(45) Date of Patent: *Apr. 16, 2002

(54) SUBSTRATE PROCESSING APPARATUS

(75) Inventors: Joichi Nishimura; Masami Ohtani, both of Kyoto; Yasuhiko Hashimoto, Hyogo, all of (JP)

(73) Assignee: Dainippon Screen Mfg. Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,027

(22) Filed: Aug. 28, 1998

(30) Foreign Application Priority Data

Sep. 1, 1997 (JP) ............................................. 9-236201
Feb. 27, 1998 (JP) ........................................... 10-047593

(51) Int. Cl.$^7$ ............................................. B65G 49/07
(52) U.S. Cl. ............................ 414/222.13; 414/226.05; 414/280; 414/744.3; 414/744.5
(58) Field of Search ....................... 414/222.01, 222.07, 414/222.12, 222.13, 226.05, 744.3, 744.5, 939, 280, 283; 901/21, 17; 74/490.04

(56) References Cited

U.S. PATENT DOCUMENTS

| | | | | |
|---|---|---|---|---|
| 4,181,465 A | * | 1/1980 | Ridderstrom | 901/17 |
| 4,534,697 A | * | 8/1985 | Poncet | 901/21 X |
| 4,904,153 A | * | 2/1990 | Iwasawa et al. | 414/735 |
| 5,020,323 A | * | 6/1991 | Hurlimann | 901/21 X |
| 5,064,340 A | * | 11/1991 | Genov et al. | 414/744.5 |
| 5,176,490 A | * | 1/1993 | Ibe | 901/21 X |
| 5,178,512 A | * | 1/1993 | Skrobak | 414/744.5 |
| 5,375,958 A | * | 12/1994 | Kluttermann | 414/280 X |
| 5,664,254 A | * | 9/1997 | Ohkura et al. | 414/222.13 X |
| 5,668,733 A | * | 9/1997 | Morimoto et al. | 414/222.13 X |
| 5,733,096 A | * | 3/1998 | Van Doren et al. | 414/744.3 |
| 5,771,748 A | * | 6/1998 | Genov et al. | 414/744.3 |
| 5,779,799 A | * | 7/1998 | Davis | 414/222.13 X |
| 5,788,447 A | * | 8/1998 | Yonemitsu et al. | 414/939 |
| 6,146,083 A | * | 11/2000 | Iwasaki | 414/744.3 |
| 6,155,768 A | * | 12/2000 | Bacchi et al. | 414/744.5 |
| 6,190,114 B1 | * | 2/2001 | Ogawa et al. | 414/744.5 |
| 6,267,549 B1 | * | 7/2001 | Brown et al. | 414/744.5 |
| 6,299,404 B1 | * | 10/2001 | Muka et al. | 414/744.5 |

FOREIGN PATENT DOCUMENTS

JP 316184 * 12/1989 ............. 414/744.5

* cited by examiner

Primary Examiner—James W. Keenan
(74) Attorney, Agent, or Firm—Ostrolenk, Faber, Gerb & Soffen, LLP

(57) ABSTRACT

A substrate processing apparatus includes a transport robot (TR1) formed with a telescopic vertical movement mechanism of a so-called telescopically nestable multi-tier construction. A drive mechanism (D1) is initially driven to move a support member (48) upwardly to simultaneously elevate a vertical movement member (42d). As the vertical movement member (42d) rises, a pulley (47c) simultaneously moves upwardly. As the pulley (47c) moves upwardly, a vertical movement member (42c) is lifted upwardly by a belt (L1). Similar actions elevate a pair of transport arms (31a, 31b) provided on the top of a vertical movement member (42a). The increase in the number of tiers of the nestable multi-tier structure precludes the increase in height of the transport robot (TR1) in its retracted position. The substrate processing apparatus, if having an increased height, is capable of transporting a substrate to and from processing portions and eliminates the need to reassemble and adjust the transport robot (TR1) for transportation of the apparatus.

8 Claims, 14 Drawing Sheets

SUBSTRATE PROCESSING APPARATUS

BACKGROUND OF THE INVENTION

1. Field of the Invention

The present invention relates to a substrate processing apparatus for performing a series of processes such as thermal processing and chemical liquid processing upon sheet-like substrates (hereinafter referred to simply as "substrates") such as semiconductor substrates and glass substrates for liquid crystal display, and a substrate transport apparatus to be applied to the substrate processing apparatus.

2. Description of the Background Art

Hithertofore, in a substrate processing apparatus for performing a series of predetermined processes such as thermal processing and chemical liquid processing upon a substrate, a transport robot has been used to transport the substrate between a heating portion for heating the substrate, a cooling portion for cooling the substrate, and a chemical liquid processing portion for processing the substrate using a chemical liquid to perform the series of processes upon the substrate in predetermined order. Such a substrate processing apparatus is typically placed in a clean room in which temperature, humidity and particles are controlled.

In recent years, the diameter of substrate wafers has become greater, and some substrate wafers with a diameter of not less than 300 mm have been handled. The increase in the size of the semiconductor wafers necessitates the increase in the size of processing portions for processing the substrate wafers, accordingly resulting in the increase in the size of the whole substrate processing apparatus.

On the other hand, the increase in the size of the substrate processing apparatus is not desirable in terms of clean room control for the reasons to be described below. The maintenance of the clean room requires special facilities such as a temperature and humidity control unit and a filter, in some cases a chemical absorption filter for resists of a chemical thickening type particularly in recent years. Thus, the increase in the area (referred to hereinafter as a "footprint") occupied two-dimensionally by the substrate processing apparatus leads to the increase in environmental maintenance costs.

To suppress the increase in the footprint of the substrate processing apparatus, there has been proposed and in use a substrate processing apparatus including processing portions such as the chemical liquid processing portion, the heating portion, and the cooling portion which are vertically stacked in plural tiers.

The substrate processing apparatus with the processing portions vertically stacked in multiple tiers may suppress the increase in the footprint thereof but is disadvantageous in that the height thereof increases as the number of tiers increases. With the increase in the height of the substrate processing apparatus, the height of a transport robot for transporting a substrate to the processing portions also increases.

For transportation of such a fabricated substrate processing apparatus to a semiconductor manufacturing plant, it is necessary to divide the substrate processing apparatus into upper and lower parts because of a freight height limit of transportation means (for example, an upper limit of 2200 mm in the case of air transportation). In this case, it is also necessary to divide the transport robot into upper and lower parts or to remove the transport robot from the substrate processing apparatus for transportation. In either case, the transport robot is required to be reassembled and adjusted in the plant to which the transport robot is transported. This results in the inevitable increase in the number of man-hours needed for transportation and delivery of, the substrate processing apparatus.

A solution to be contemplated to such a problem is the use of an extensible mechanism, such as a pantograph structure, as a vertical movement mechanism of the transport robot, with the height of the transport robot in its retracted position being within the freight height limit. This allows the transportation of the substrate processing apparatus, with the transport robot attached to one of the upper and lower parts of the substrate processing apparatus after the division, to eliminate the need to reassemble and adjust the transport robot.

However, the pantograph structure comprises a plurality of pantograph links, and it is impossible to move the transport robot to a level lower than the level or height corresponding to the thickness of the plurality of pantograph links even when the pantograph structure is in its fully retracted position. In some cases, the transport robot is not capable of accessing a processing portion located in a lower tier. To prevent this, the pantograph links should have a greater length so that a smaller number of pantograph links constitute the vertical movement mechanism. This, however, presents a need to consider the space required for the transport robot in its retracted position to ensure an area wherein the transport robot is to be located, resulting in the increase in the footprint of the substrate processing apparatus.

SUMMARY OF THE INVENTION

The present invention is directed to an apparatus for processing a substrate.

According to the present invention, the apparatus comprises: a) a plurality of processing parts vertically stacked, each of which is operable to process a substrate; and b) transport means for transporting a substrate from and to the plurality of processing parts. The transport means comprises: b-1) an arm for holding the substrate and operable to get access to the plurality of processing parts; and b-2) a telescopic elevator for elevating and lowering the arm, comprising: a first telescopic element; and a second telescopic element which is inserted into the first telescopic element to lower the arm and is withdrawn from the first telescopic element to elevate the arm.

Even if the plurality of processing parts vertically stacked are tall in height, the substrate can be transported from and to each processing part. On the other hand, the transport means can be reduced in height by inserting the first telescopic element into the second telescopic element, so that the transport means is introduced into a factory without separating respective elements thereof. Re-composition of the transport means in the factory is not required and complicated adjustments of the transport means in the factory are prevented. Further, the transport means is not so wide even if the telescopic elevator is reduced in height. This is effective to reduce the area required for the transport means and, accordingly, to reduce the total area occupied by the apparatus for processing a substrate.

In an aspect of the present invention, the transport means further comprises: b-3) a cover mechanism for covering the telescopic elevator. The cover mechanism comprises a first cover member for covering a first part of the telescopic elevator, and a second cover member for covering a second part of the telescopic elevator.

The first cover member is inserted into the second cover member in response to retraction of the telescopic elevator and is withdrawn from the second cover member in response to extension of the telescopic elevator.

Particles generated around the telescopic elevator are blocked by the cover mechanism and are not diffused to the processing parts.

In a preferred embodiment of the present invention, the transport means further comprises: b-4) rotation means for rotating the arm around a vertical axis.

Preferably, the rotation means is provided at a top portion of the telescopic elevator. It is not required to rotate the telescopic elevator as a whole and vibrations accompanied with rotation of the arm are reduced. Turbulence of air around the transport means is also reduced and electric power for rotating the arm is relatively small. Wiring-arrangement by cables is relatively simple and maintenance of the apparatus is easy.

Accordingly, an object of the present invention is to reduce the area of an apparatus for processing a substrate in which processing parts are vertically stacked and transport means gets access to respective processing parts.

Another object of the present invention is to omit re-composition and adjustment of respective elements of the apparatus when the apparatus is introduced into a factory.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. Overall Construction of Substrate Processing Apparatus>

Figure 1A:
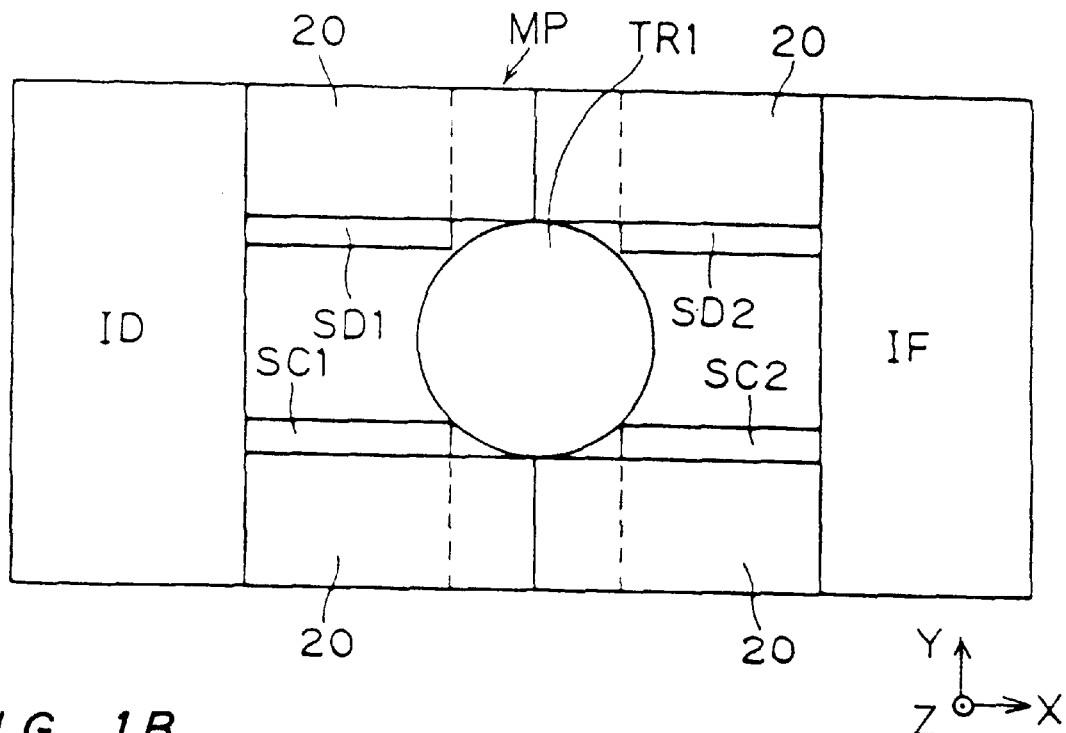
FIG. 1A is a plan view of a substrate processing apparatus according to a preferred embodiment of the present invention.
Figure 1B:
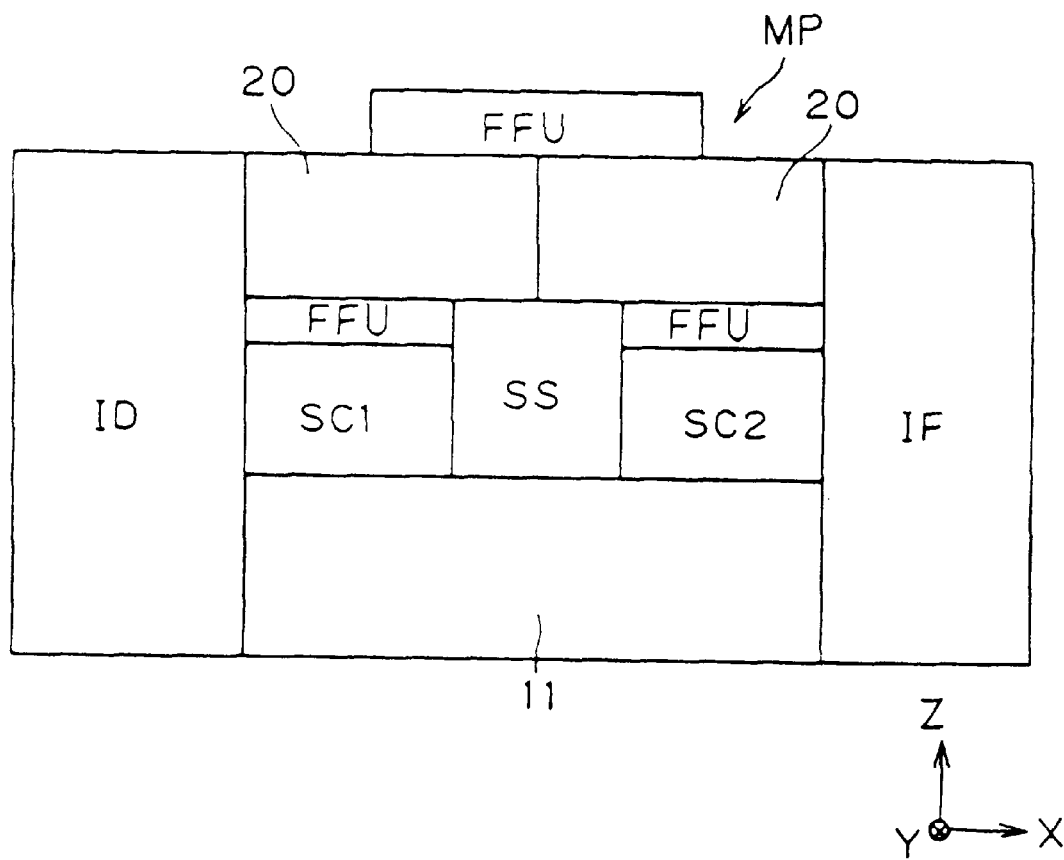
FIG. 1B is a front view of the substrate processing apparatus of FIG. 1A.

The overall construction of a substrate processing apparatus will be initially described according to the present invention. FIG. 1A is a plan view of the substrate processing apparatus of a preferred embodiment according to the present invention, and FIG. 1B is a front view of the apparatus of FIG. 1A. An XYZ orthogonal coordinate system is additionally shown in FIGS. 1A and 1B for purposes of clarifying the relationship between the directions of the apparatus. The horizontal plane parallel to the floor surface is defined herein as an XY plane, and the vertical direction as a Z direction.

With reference to FIGS. 1A and 1B, the substrate processing apparatus of the preferred embodiment according to the present invention comprises in indexer ID for loading and unloading a substrate, a unit arrangement portion MP in which a plurality of processing units for processing the substrate and substrate transport means for transporting the substrate to the processing units are arranged, and an interface IF provided for transport of the substrate between an exposure apparatus not shown and the unit arrangement portion MP.

The unit arrangement portion MP includes at its bottom a chemical cabinet 11 for accommodating piping and a tank for storing a chemical agent. On the four top corners of the chemical cabinet 11, coating units SC1 and SC2 (spin coaters) for applying a resist to a substrate while spinning the substrate, and developing units SD1 and SD2 (spin developers) for developing the exposed substrate are arranged, respectively, as liquid processing units for processing the substrate using processing liquids. Over these liquid processing units, multi-tier thermal processing units 20 for thermally processing the substrate are arranged in front and rear parts of the apparatus. A cleaning unit SS (spin scrubber) for supplying a cleaning liquid such as de-ionized water to the substrate to clean the substrate while spinning the substrate is disposed as a substrate processing unit in a front part (on the negative side in the Y direction) of the apparatus and between the coating units SC1 and SC2.

A transport robot TR1 serving as the substrate transport means for accessing all of the surrounding processing units to transfer the substrate thereto and therefrom is disposed in a central part of the apparatus which is surrounded by the coating units SC1 and SC2 and the developing units SD1 and SD2. The transport robot TR1 is movable in the vertical direction and rotatable on a central vertical axis. The transport robot TR1 will be described later in detail.

A filter fan unit FFU for forming a downflow of clean air is provided on the top of the unit arrangement portion MP. Filter fan units FFU for forming a downflow of clean air toward the liquid processing units are also provided immediately under the multi-tier thermal processing units 20.

Figure 2:
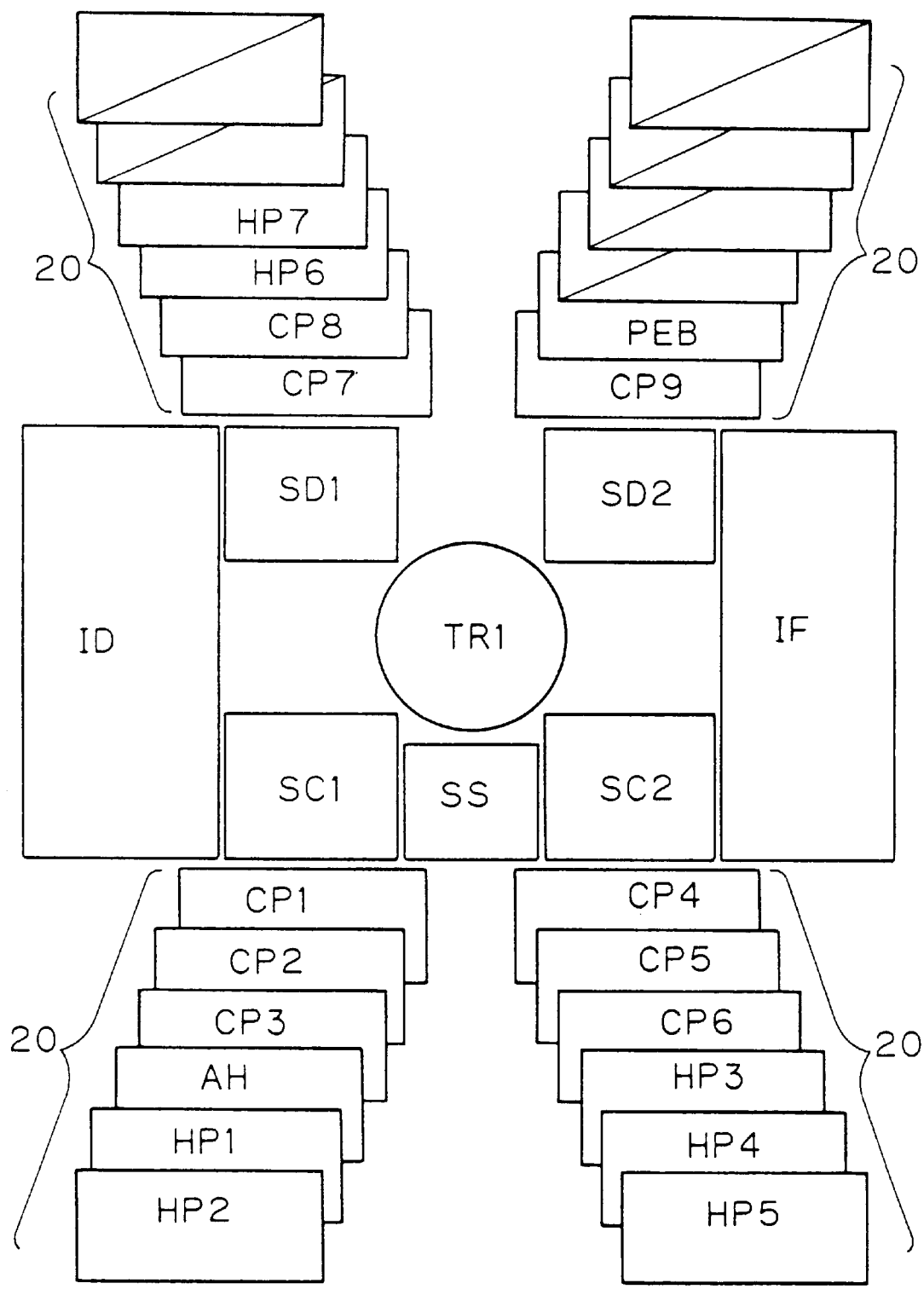
FIG. 2 illustrates the arrangement of processing units constituting the apparatus of FIG. 1A.

FIG. 2 illustrates the arrangement of the processing units of FIGS. 1A and 1B. Six thermal processing units vertically stacked in tiers as a multi-tier thermal processing unit 20 are arranged over the coating unit SC1. A cool plate portion CP1 for cooling a substrate is provided in the lowest tier position of the multi-tier thermal processing unit 20. Similar cool plate portions CP2 and CP3 are provided in the second and third tier positions from the bottom, respectively. An adhesion promotion portion AH for performing adhesion promotion processing on a substrate is provided in the fourth tier position from the bottom, and hot plate portions HP1 and HP2 for heating a substrate are provided in the fifth and sixth tier positions from the bottom, respectively.

Six thermal processing units vertically stacked in tiers as a multi-tier thermal processing unit 20 are arranged also over the coating unit SC2. Cool plate portions CP4 to CP6 are provided in the first to third tier positions from the bottom of the multi-tier thermal processing unit 20, respectively. Hot plate portions HP3 to HP5 are provided in the fourth to sixth tier positions from the bottom, respectively.

Four thermal processing units vertically stacked in tiers as a multi-tier thermal processing unit 20 are arranged also over the developing unit SD1. Cool plate portions CP7 and CP8 are provided in the first and second tier positions from the bottom of the multi-tier thermal processing unit 20, respectively. Hot plate portions HP6 and HP7 are provided in the third and fourth tier positions from the bottom, respectively. Although the uppermost two tiers are vacant in the apparatus of this preferred embodiment, a hot plate portion, a cool plate portion, or other thermal processing units may be installed in the uppermost two tiers in accordance with applications and purposes.

Two thermal processing units vertically stacked in tiers as a multi-tier thermal processing unit 20 are arranged also over the developing unit SD2. A cool plate portion CP9 is provided in the lowest tier position of the multi-tier thermal processing unit 20. An post-exposure bake plate portion PEB for performing baking processing on a substrate after exposure is provided in the second tier position from the bottom. Although the uppermost four tiers are vacant in the apparatus of this preferred embodiment, a hot plate portion, a cool plate portion, or other thermal processing units may be installed in the uppermost four tiers in accordance with applications and purposes.

The transport robot TR1 provided in the central part of the unit arrangement portion MP sequentially transports a substrate to and from the liquid processing units and the thermal processing units for execution of predetermined processes on the substrate.

The interface IF has the function of temporarily stocking therein a substrate which has been resist-coated in the unit arrangement portion MP and which is to be transferred to the exposure apparatus and an exposed substrate received from the exposure apparatus, and comprises a robot for transferring the substrates from and to the transport robot TR1, and a buffer cassette for placing the substrates thereon although not shown.

<2. First Construction of Transport Robot>

Figure 3:
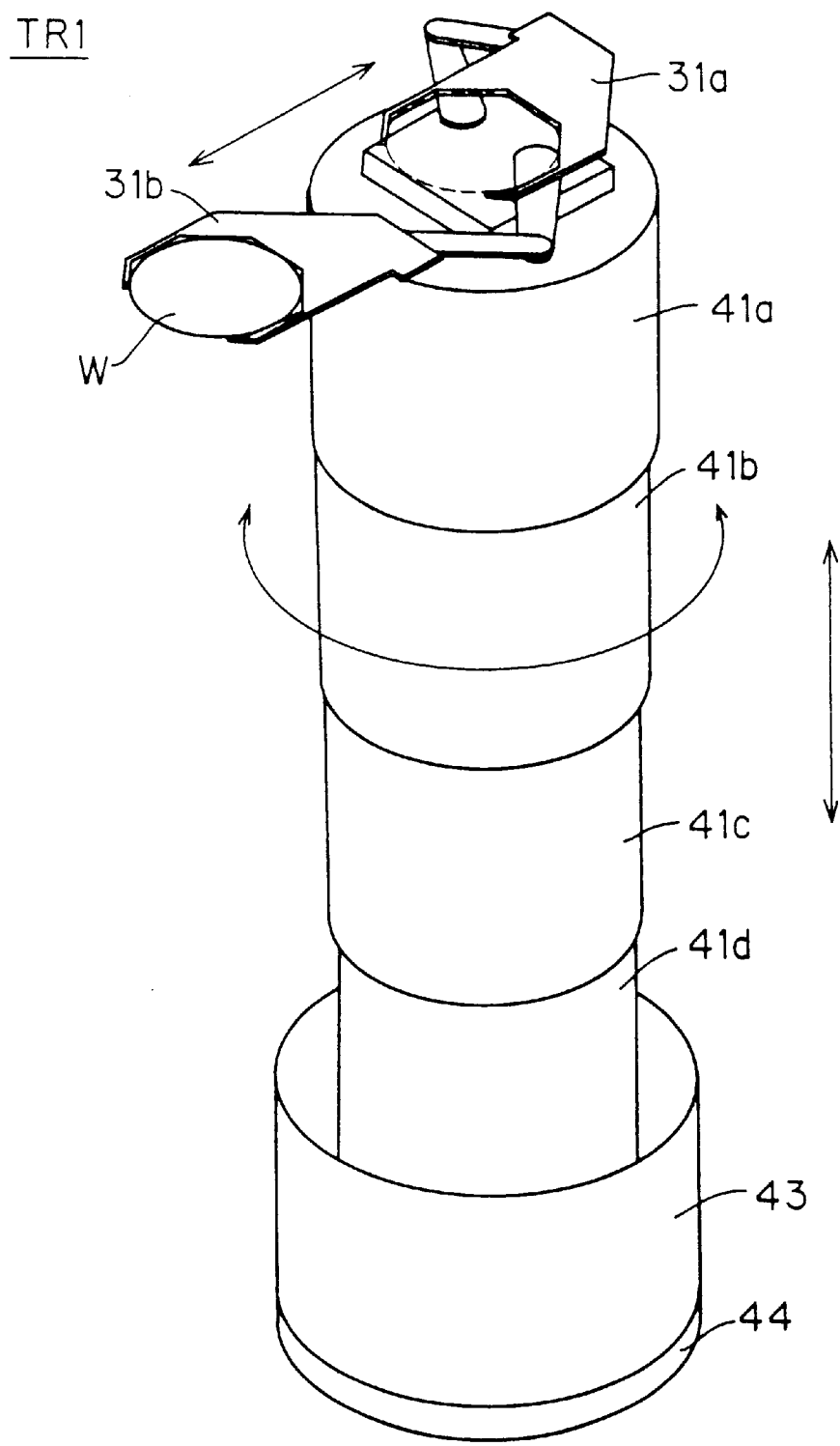
FIG. 3 is a perspective outside view of a transport robot in a unit arrangement portion of the apparatus of FIG. 1A.

The transport robot TR1 will be discussed hereinafter. FIG. 3 is a perspective outside view of the transport robot TR1. The transport robot TR1 comprises a horizontal movement mechanism for horizontally moving a pair of transport arms 31a and 31b each for holding a substrate, a telescopic vertical movement mechanism (telescopic elevator) for vertically moving the pair of transport arms 31a and 31b by telescopic extension and retraction, and a rotative drive mechanism for rotating the pair of transport arms 31a and 31b on a vertical axis. These mechanisms allow the threedimensional movement of the transport arms 31a and 31b .

The telescopic vertical movement mechanism of the transport robot TR1 of the substrate processing apparatus according to the present invention is an extension/retraction mechanism of a so-called telescopic type. Specifically, a cover 41d is telescopically receivable within a cover 41c, the cover 41c is telescopically receivable within a cover 41b, and the cover 41b is telescopically receivable within a cover 41a. For downward movement of the transport arms 31a and 31b, the covers 41a to 41d are sequentially nested. On the other hand, for upward movement of the transport arms 31a and 31b, the covers 41a to 41d in a nested relationship are sequentially pulled out or extended. These covers 41a to 41d are provided to prevent the dust produced during the operation of the telescopic vertical movement mechanism provided therewithin from being emitted out of the transport robot TR1, thereby suppressing adhesion of particles to substrates.

The transport robot TR1 is installed on a base or support structure 44. The rotative drive mechanism is designed to rotate on the central axis of the base 44. A fixed cover 43 is fixedly mounted on the base 44.

Figure 4:
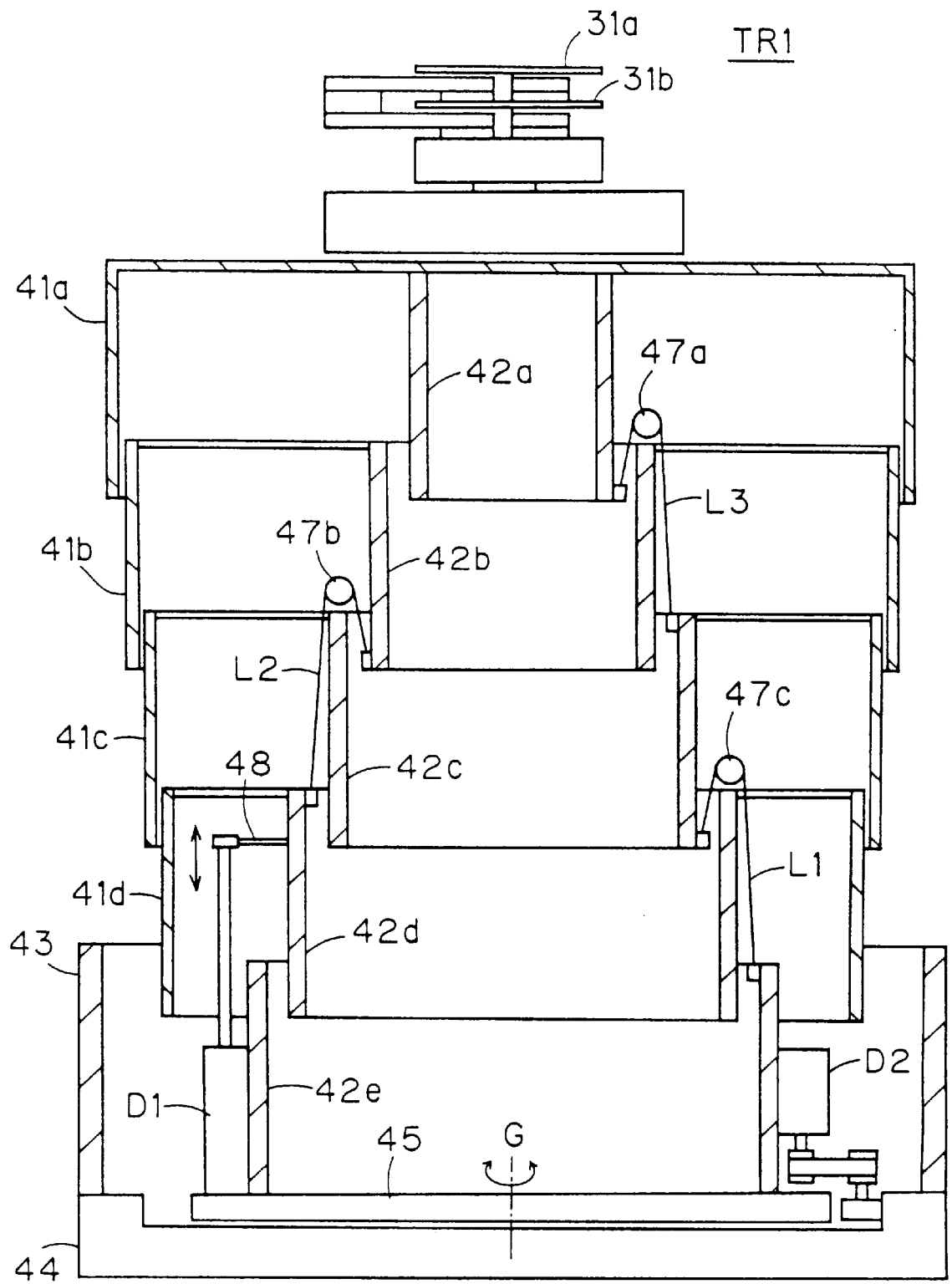
FIGS. 4 and 5 are sectional side views showing an internal structure of the transport robot in the unit arrangement portion of the apparatus of FIG. 1A.
Figure 5:
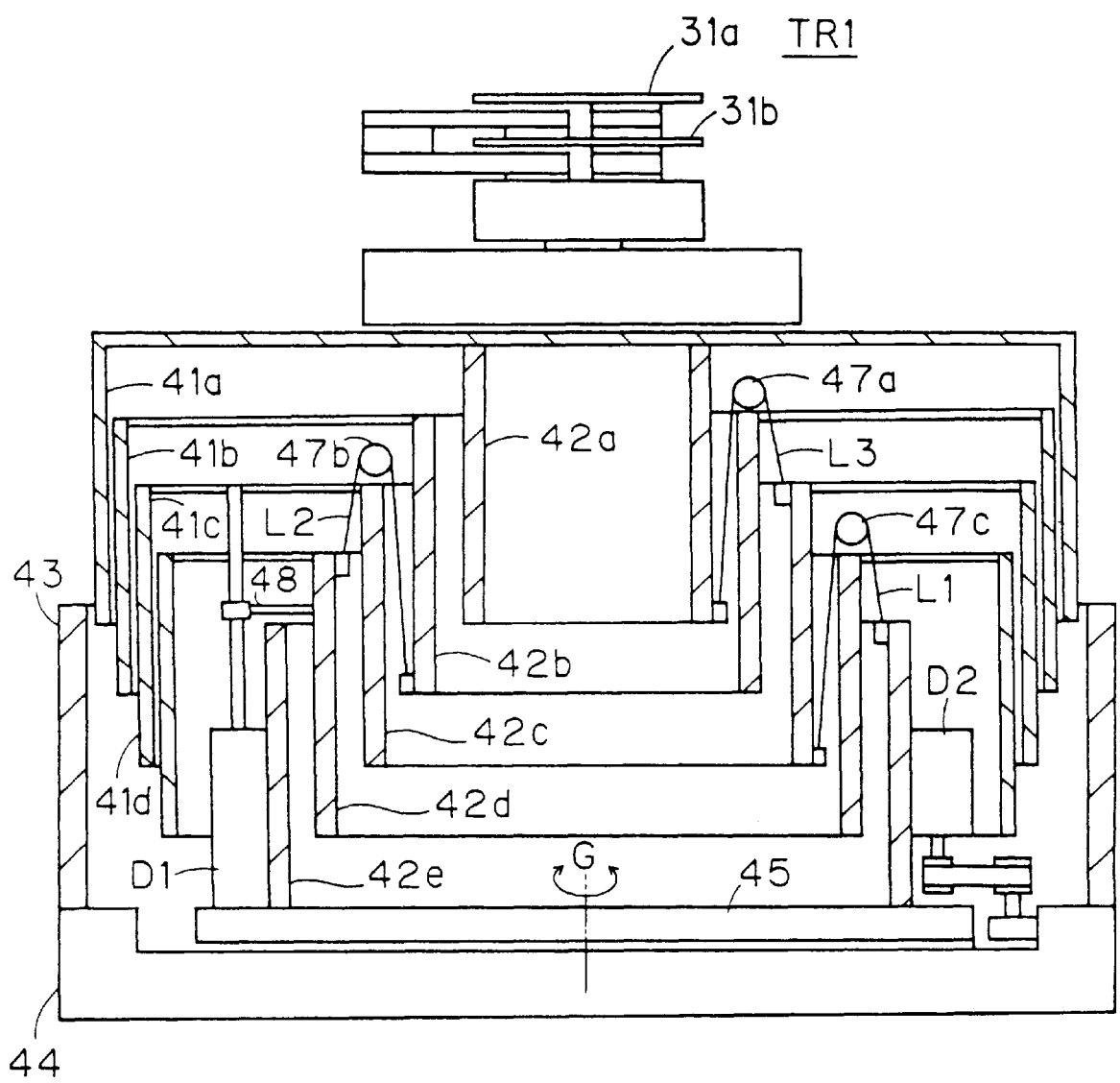

FIGS. 4 and 5 are sectional side views for illustrating the operation of the transport robot TR1. FIG. 4 shows the transport robot TR1 with the telescopic vertical movement mechanism placed in its extended position, and FIG. 5 shows the transport robot TR1 with the telescopic vertical movement mechanism placed in its retracted position. As shown in FIGS. 4 and 5, the inside of the transport robot TR1 has the above described telescopically nestable multi-tier structure. With the telescopic vertical movement mechanism in the retracted position, a vertical movement member 42a is telescopically received within a vertical movement member 42b, the vertical movement member 42b is telescopically received within a vertical movement member 42c, the vertical movement member 42c is telescopically received within a vertical movement member 42d, and the vertical movement member 42d is telescopically received within a fixed member 42e.

For example, the relationship between the vertical movement members 42a and 42b is such that the vertical movement member 42a is telescopically received within the vertical movement member 42b. Thus, the vertical movement member 42b serves as a container member, and the vertical movement member 42a serves as an insert member. The relationship between the vertical movement members 42b and 42c is such that the vertical movement member 42b is telescopically received within the vertical movement member 42c. Thus, the vertical movement member 42c serves as a container member, and the vertical movement member 42b serves as an insert member. With reference to the relationship between the vertical movement members 42a to 42c, the vertical movement member 42a serves as a third telescopic element, the vertical movement member 42b as a second telescopic element, and the vertical movement member 42c as a first telescopic element. With reference to the relationship between the vertical movement members 42b to 42d, the vertical movement member 42b serves as the third telescopic element, the vertical movement member 42c as the second telescopic element, and the vertical movement member 42d as the first telescopic element. With reference to the relationship between the vertical movement members 42c and 42d and the fixed member 42e, the vertical movement member 42c serves as the third telescopic element, the vertical movement member 42d as the second telescopic element, and the fixed member 42e as the first telescopic element.

Pulleys 47a, 47band 47care mounted to the vertical movement members 42b, 42c and 42d, respectively. Belts L3, L2 and L1 are mounted on the pulleys 47a, 47b and 47c, respectively. The belt L1 has a first end fixed to an upper part of the fixed member 42e, and a second end fixed to a lower part of the vertical movement member 42c. Likewise, the belt L2 is fixed to an upper part of the vertical movement member 42d and a lower part of the vertical movement member 42b, and the belt L3 is fixed to an upper part of the vertical movement member 42c and a lower part of the vertical movement member 42a.

A drive mechanism D1, such as a motor, installed on a rotating table 45 is driven to vertically move a support member 48, thereby elevating and lowering the vertical movement member 42d secured to the support member 48. Elevating the transport arms 31a and 31b by extending the telescopic vertical movement mechanism is discussed below. The drive mechanism D1 is initially driven to move the support member 48 upwardly to simultaneously elevate the vertical movement member 42d. As the vertical movement member 42d rises, the pulley 47c mounted thereto simultaneously moves upwardly. Since the belt L1 is fixed at its first end to the fixed member 42e and is of a fixed length, the vertical movement member 42c is lifted upwardly by the belt L1 as the pulley 47c rises. As the vertical movement member 42c rises, the pulley 47b mounted thereto rises, and the vertical movement member 42b is accordingly lifted upwardly by the belt L2. As the vertical movement member 42b rises, the pulley 47amounted thereto rises, and the vertical movement member 42a is accordingly lifted upwardly by the belt L3. In this manner, the transport arms 31a and 31b provided above the vertical movement member 42a are elevated.

Conversely, lowering the transport arms 31a and 31b by the retraction of the telescopic vertical movement mechanism is as follows. The drive mechanism D1 is driven to move the support member 48 downwardly. Then, the vertical movement members 42a to 42d sequentially cooperate to move downwardly so that each vertical movement member serving as the container member receives its associated vertical movement member serving as the insert member.

The covers 41a to 41d are mounted to the vertical movement members 42a to 42d, respectively. The vertical movement of the covers 41a to 41d is responsive to the operation of the vertical movement members 42a to 42d. The cover 41a is formed to cover the top and side surfaces of the telescopic vertical movement mechanism whereas the covers 41b, 41cand 41d are formed to cover only the side surface of the telescopic vertical movement mechanism. The covers 41a to 41d are connected to the vertical movement members 42a to 42d so as not to interfere with the operations of the movable parts such as the pulleys and the belts.

The mechanism for vertically moving the support member 48 by driving the drive mechanism D1 such as a motor may employ a rack and pinion to convert the rotary motion of the motor into the vertical movement, or other means.

A drive mechanism D2 is a drive mechanism for rotating the rotating table 45 on an axis G of the base 44, and comprises a motor and the like. The rotation of the rotating table 45 on the axis G enables the transport arms 31a and 31b to rotate on the axis G.

Thus, the transport robot TR1 includes the telescopic vertical movement mechanism having the telescopically nestable multi-tier structure. If a substrate is transported to the processing units at a higher position, the number of tiers of the nestable structure may be increased to suppress the height of the transport robot TR1 in the retracted position and the space in the direction of the width thereof in the retracted position, thereby preventing the increase in footprint of the substrate processing apparatus. Additionally, the transport robot TR1 is capable of transporting a substrate to the processing portions of the substrate processing apparatus which is high in size, and is not required to be reassembled and adjusted after the transportation of the apparatus.

Figure 6:
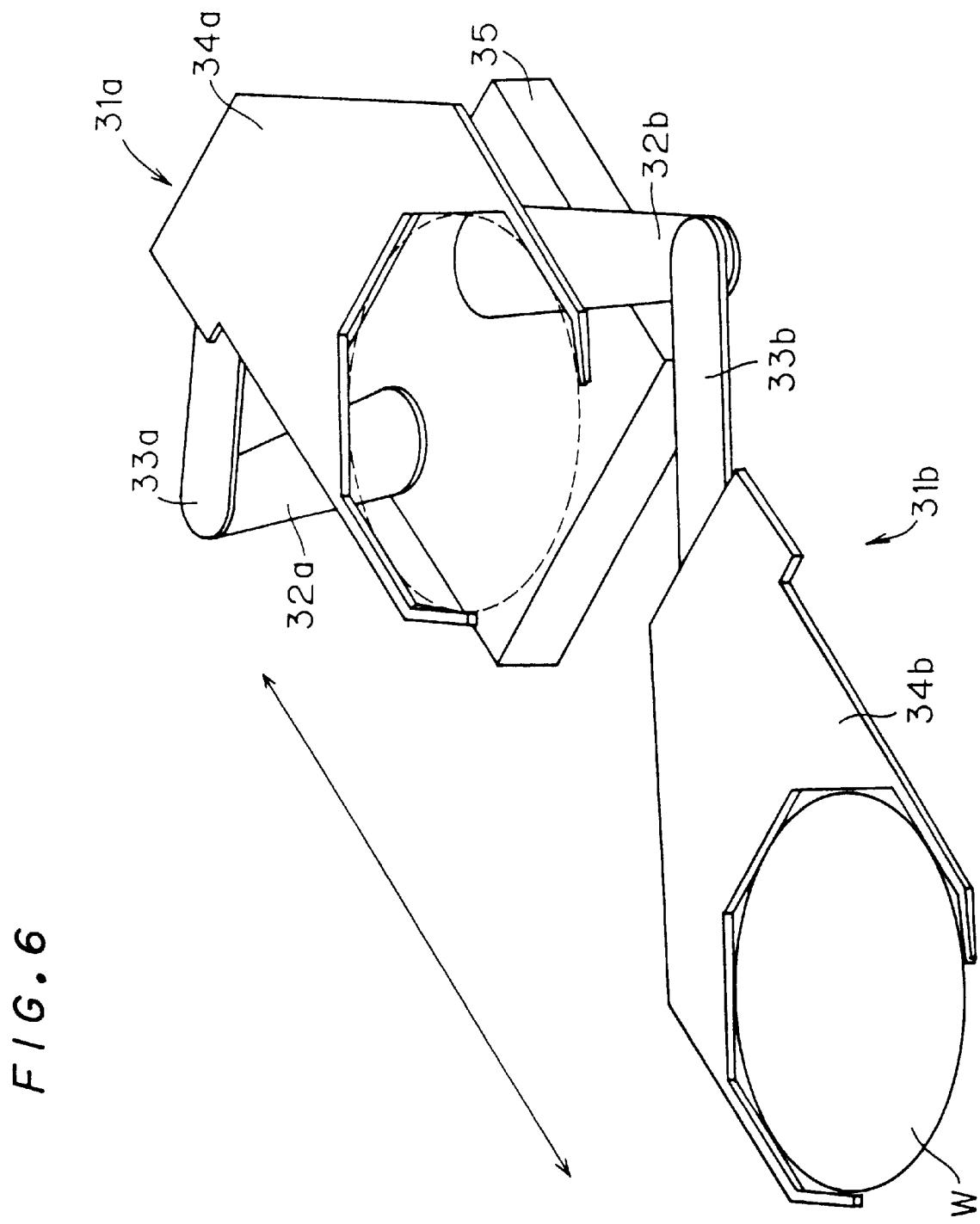
FIG. 6 is a perspective view of transport arms of the transport robot in the unit arrangement portion of the apparatus of FIG. 1A.

The transport arms 31a and 31b of the transport robot TR1 is described below. FIG. 6 shows the construction of the transport arms 31a and 31b.

The pair of transport arms 31a and 31b which are generally similar in construction are mounted on a stage 35. The transport arms 31a and 31b are folded and unfolded to cause first arm segments 34a and 34b coupled to distal ends of the transport arms 31a and 31b to move straight in the horizontal direction while the first arm segments 34a and 34b maintain their attitudes relative to the stage 35, respectively. The first arm segments 34a and 34b are coupled to second arm segments 33a and 33b which in turn are coupled to third arm segments 32a and 32b, respectively. These arm segments are designed so as not to interfere with each other during the operation of the transport arms 31a and 31b. The transport arms 31a and 31b may be alternately folded and unfolded to take a processed substrate W out of a processing unit placed in front of the transport arms 31a and 31b and to transport an unprocessed substrate W into the processing unit.

Figure 7:
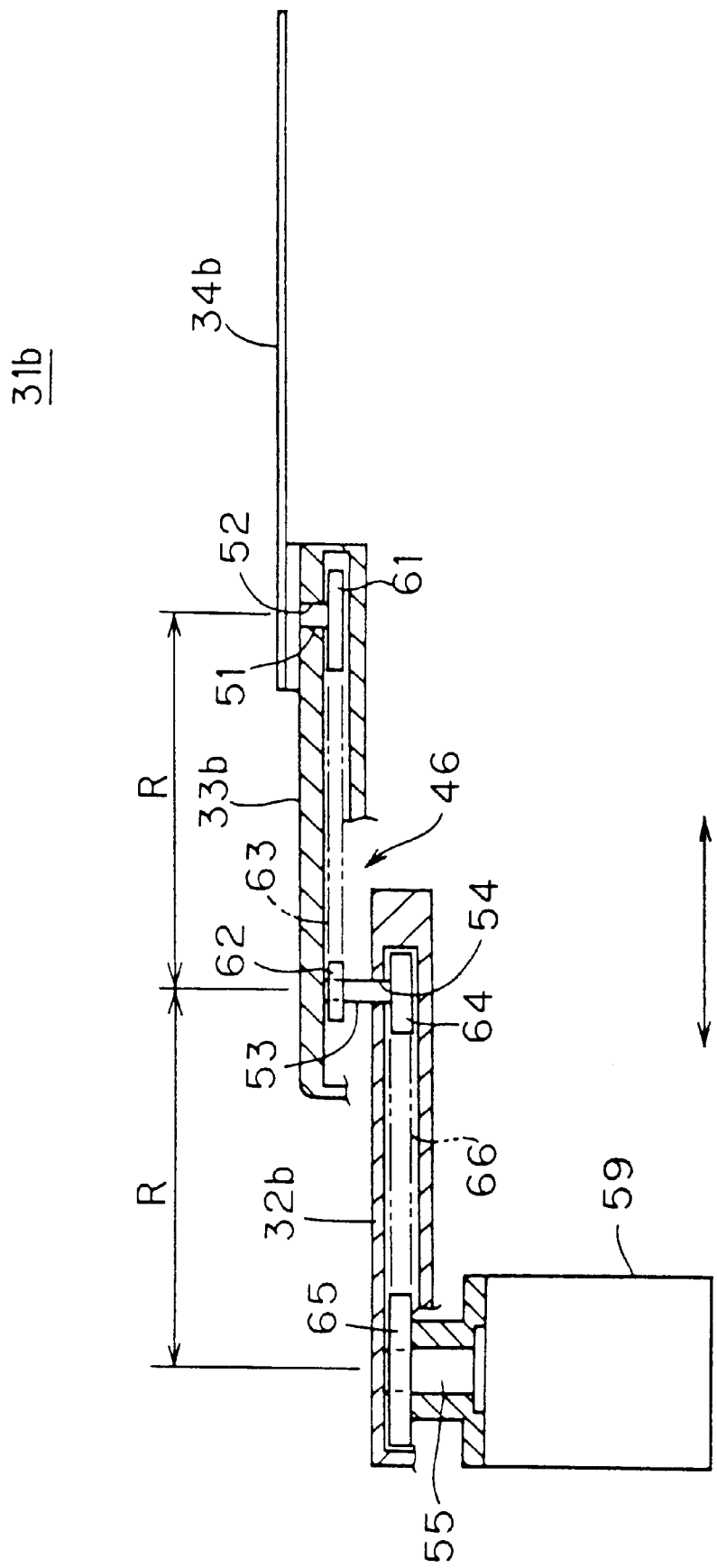
FIG. 7 illustrates an extension/retraction mechanism of a transport arm shown in FIG. 6.

Each of the transport arms 31a and 31b is constructed as shown in FIG. 7. FIG. 7 is a sectional side view showing the internal construction of the transport arm 31b. It is needless to say that the transport arm 31a also has the similar construction. The transport arm 31b includes the first arm segment 34b at the distal end thereof for placing the substrate W thereon, the second arm segment 33b for pivotably supporting the first arm segment 34b within the horizontal plane, the third arm segment 32b for pivotably supporting the second arm segment 33b within the horizontal plane, a rotative drive unit 59 for causing the third arm segment 32b to pivot within the horizontal plane, and power transmission means 46 serving as a foldable mechanism for transmitting power to the second arm segment 33b and the first arm segment 34b when the rotative drive unit 59 causes the third arm segment 32b to pivot, to control the attitudes and direction of movement of the second and first arm segments 33b and 34b.

A vertically downwardly extending first pivot shaft 51 is fixed beneath the proximal end of the first arm segment 34b. A first bearing hole 52 for pivotably receiving the first pivot shaft 51 is formed in a distal end part of the second arm segment 33b. A vertically downwardly extending second pivot shaft 53 is fixed beneath the proximal end of the second arm segment 33b. The third arm segment 32b is equal in length to the second arm segment 33b, and has a second bearing hole 54 formed in a distal end part of the third arm segment 32b for pivotably receiving the second pivot shaft 53. A vertically downwardly extending third pivot shaft 55 to which rotary power is transmitted from the rotative drive unit 59 is fixed beneath the proximal end of the third arm segment 32b.

The power transmission means 46 comprises a first pulley 61 fixed to the lower end of the first pivot shaft 51, a second pulley 62 fixed to the second pivot shaft 53 above the upper surface of the second bearing hole 54, a first belt 63 looped around and mounted on the first and second pulleys 61 and 62, a third pulley 64 fixed to the lower end of the second pivot shaft 53, a fourth pulley 65 fixed to the third arm segment 32b and loosely fitted over the third pivot shaft 55, and a second belt 66 looped around and mounted on the third and fourth pulleys 64 and 65.

The ratio of the diameter of the first pulley 61 to the diameter of the second pulley 62 is 2:1, and the ratio of the diameter of the third pulley 64 to the diameter of the fourth pulley 65 is 1:2. The distance from the first pivot shaft 51 to the second pivot shaft 53 and the distance from the second pivot shaft 53 to the third pivot shaft 55 are equal and set to R.

Figure 8:
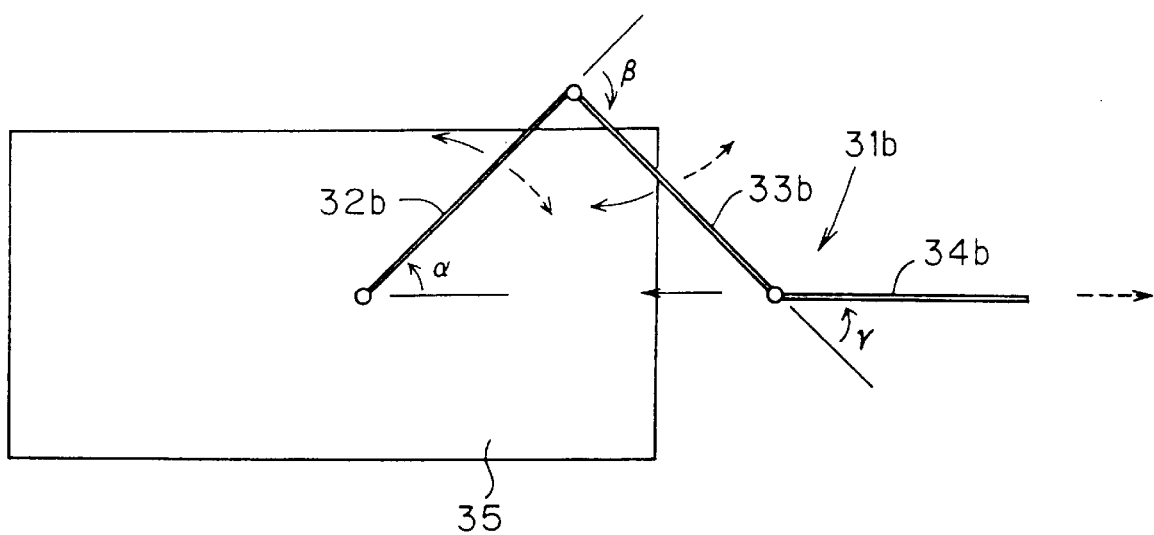
FIG. 8 illustrate the operation of the transport arm of FIG. 7.

FIG. 8 conceptually illustrates the operation of the transport arm 31b. The operation is described with reference to FIGS. 7 and 8. As the rotative drive unit 59 causes the third arm segment 32b to pivot through an angle a in a counterclockwise direction around the third pivot shaft 55, the second pivot shaft 53 received in the distal end part of the third arm segment 32*b* is rotated through an angle β=2 α, which is twice the angle of the pivotal movement of the third pivot shaft 55, in a clockwise direction in association with the actions of the second belt 66 and the third pulley 64. This permits the first pivot shaft 51 received in the distal end part of the second arm segment 33*b* to move straight in the horizontal direction. The pivot angle of the first pivot shaft 51 is controlled through the second pulley 62 and the first belt 63. Although the first pivot shaft 51 is rotated through an angle γ=α, which is ½ of the angle of the rotation of the second pivot shaft 53, in the counterclockwise direction relative to the second arm segment 33*b*, the second arm segment 33*b* itself is pivoted, and as a result the first arm segment 34*b* moves straight while maintaining the attitude relative to the rotative drive unit 59.

As described hereinabove, the transport robot TR1 includes the horizontal movement mechanism for horizontally moving the pair of transport arms 31*a* and 31*b* each for holding the substrate W, the telescopic vertical movement mechanism for vertically moving the pair of transport arms 31*a* and 31*b* by the telescopic extension and retraction, and the rotative drive mechanism for rotating the pair of transport arms 31*a* and 31*b* on the vertical axis. These mechanisms allow the three-dimensional movement of the transport arms 31*a* and 31*b* for transport of the substrate W to any processing unit.

<3. Second Construction of Transport Robot>

In the transport robot TR1 shown in sectional side view of FIGS. 4 and 5, the rotative drive mechanism is provided in the lowermost position, and the telescopic vertical movement mechanism is provided on the rotating table 45 rotated by the rotative drive mechanism, with the horizontal movement mechanism provided above the telescopic vertical movement mechanism. That is, the rotative drive mechanism, the telescopic vertical movement mechanism, and the horizontal movement mechanism are vertically arranged in order from the bottom to the top of the transport robot TR1.

Figure 9:
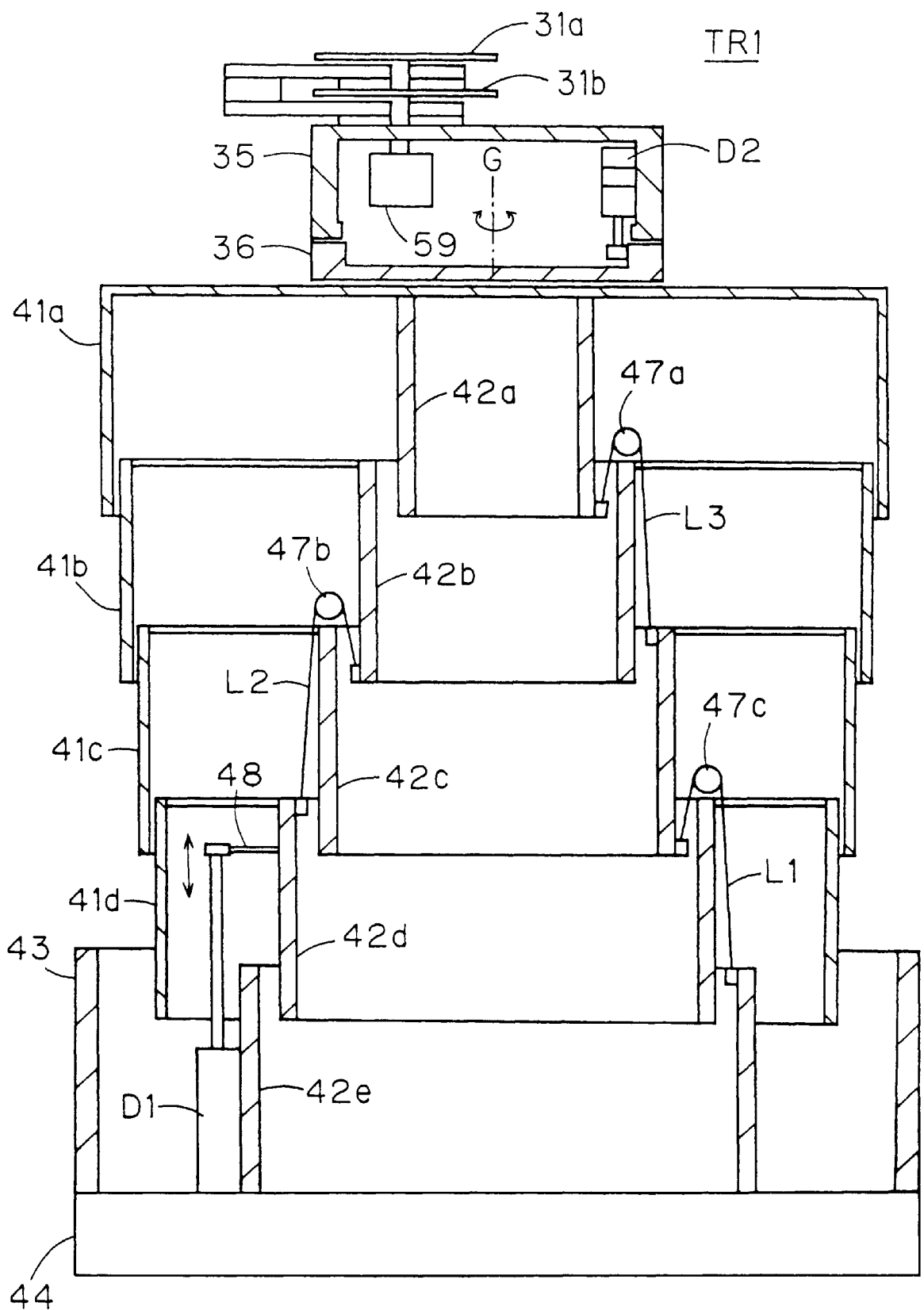
FIG. 9 is a sectional side view of an internal structure of the transport robot of a different form from that of FIGS. 4 and 5.

The construction of the transport robot TR1 of this preferred embodiment is not limited to the above described construction, but may be a construction as shown in FIG. 9. FIG. 9 is a sectional side view of the transport robot TR1 of a different construction from that of FIG. 4.

In the transport robot TR1 shown in FIG. 9, the drive mechanism D1 and fixed member 42*e* for telescopic vertical movement are fixed on the base 44. A fixed base 36 is provided on the top of the telescopic vertical movement mechanism. The stage 35 which is rotatable relative to the fixed base 36 is provided over the fixed base 36. Inside the stage 35 is provided the drive mechanism D2 for rotating the stage 35 along a guide portion formed within the fixed base 36. Thus, the stage 35 and portions placed thereon are rotated on the vertical rotational axis G by driving the drive mechanism D2. The rotation of the stage 35 allows the transport arms 31*a* and 31*b* to rotate also on the rotational axis G.

The rotative drive unit 59 shown in FIG. 9 for driving the transport arms 31*a* and 31*b* is provided for each of the transport arms 31*a* and 31*b*. The mechanisms (the telescopic vertical movement mechanism and the horizontal movement mechanism) other than the rotative drive mechanism shown in FIG. 9 are similar to those described above, and the description thereof will be dispensed with herein.

In this manner, the transport robot TR1 shown in FIG. 9 features the drive mechanism D2 provided inside the stage 35 shown in FIG. 6 for rotating the stage 35, and the rotative drive mechanism overlying the telescopic vertical movement mechanism. Therefore, the telescopic vertical movement mechanism is not rotated when the rotative drive mechanism is placed in operation.

The construction of the transport robot TR1 shown in FIGS. 4 and 5 wherein the rotative drive mechanism, the telescopic vertical movement mechanism, and the horizontal movement mechanism are vertically arranged in order from the bottom to the top of the transport robot TR1 might present the problem of runouts relative to the vertical axis of the transport robot TR1 since almost all parts of the transport robot TR1 are rotated when the rotative drive mechanism is operated with the telescopic vertical movement mechanism placed in its completely extended position.

On the other hand, with the transport robot R1 designed such that the rotative drive mechanism is provided on the telescopic vertical movement mechanism as shown in FIG. 9, the telescopic vertical movement mechanism is not rotated when the rotative drive mechanism is in operation with the telescopic vertical movement mechanism placed in the maximum extended position. This significantly reduces the likelihood that the runouts resulting from rotation occur, and achieves the stable rotation of the stage 35 to further enhance the precision of the angle of rotation and the speed of rotation. Additionally, since the drive mechanism D2 requires a smaller amount of power, power consumed by the rotative drive mechanism is also effectively reduced.

Further, with the transport robot TR1 of the construction shown in FIG. 9, the fixed base 36 and the portions therebelow are not rotated when the transport arms 31*a* and 31*b* are rotated on the axis G. Therefore, this construction may suppress the turbulence of air stream in the unit arrangement portion MP as compared with the construction of the transport robot TR1 almost all portions of which are rotated.

In general, cables to be drawn out of a rotative drive portion associated with a rotational operation require a complicated cable arrangement in consideration for the rotational operation. However, the construction of the transport robot TR1 as shown in FIG. 9 allows such complicated cable arrangement to be received within the vertical movement members 42*a* to 42*d* of the telescopic vertical movement mechanism. This construction eliminates the need for consideration of the rotational operation to arrange the cables to be introduced outwardly of the transport robot TR1, simplifying the cable arrangement.

Furthermore, if a trouble occurs in the drive mechanism D2 and the like, the fixed base 36 and the portions thereon may be removed from the transport robot TR1 for repair purposes. Therefore, maintenance performance is enhanced.

The transport robot TR1 constructed such that the rotative drive mechanism is provided on the telescopic vertical movement mechanism produces the above described specific effects to provide a more preferred embodiment.

<4. Operation of Transport Robot>

Figure 10:
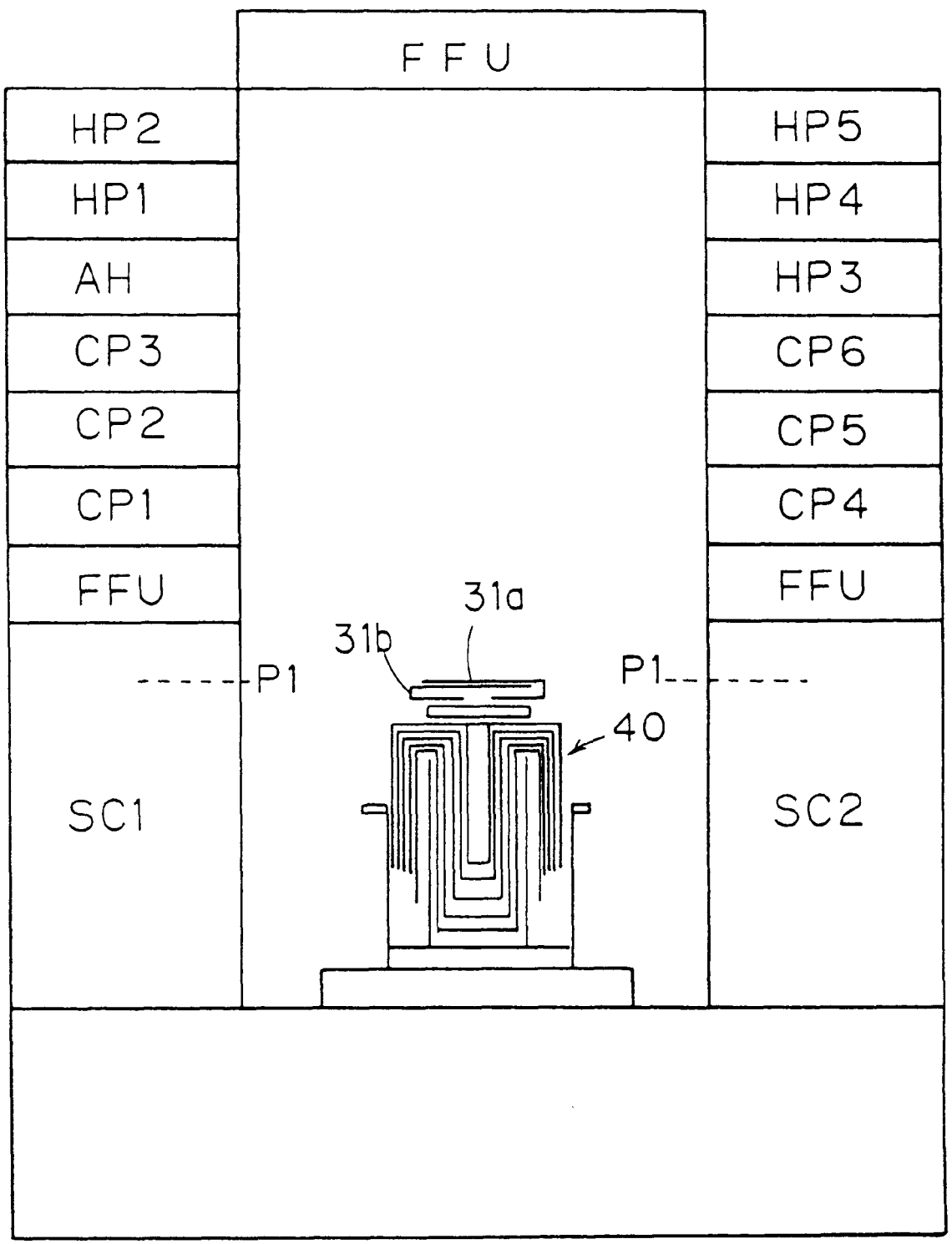
FIG. 10 illustrates the vertical movement of the transport robot of FIG. 3 when accessing a liquid processing unit.
Figure 11:
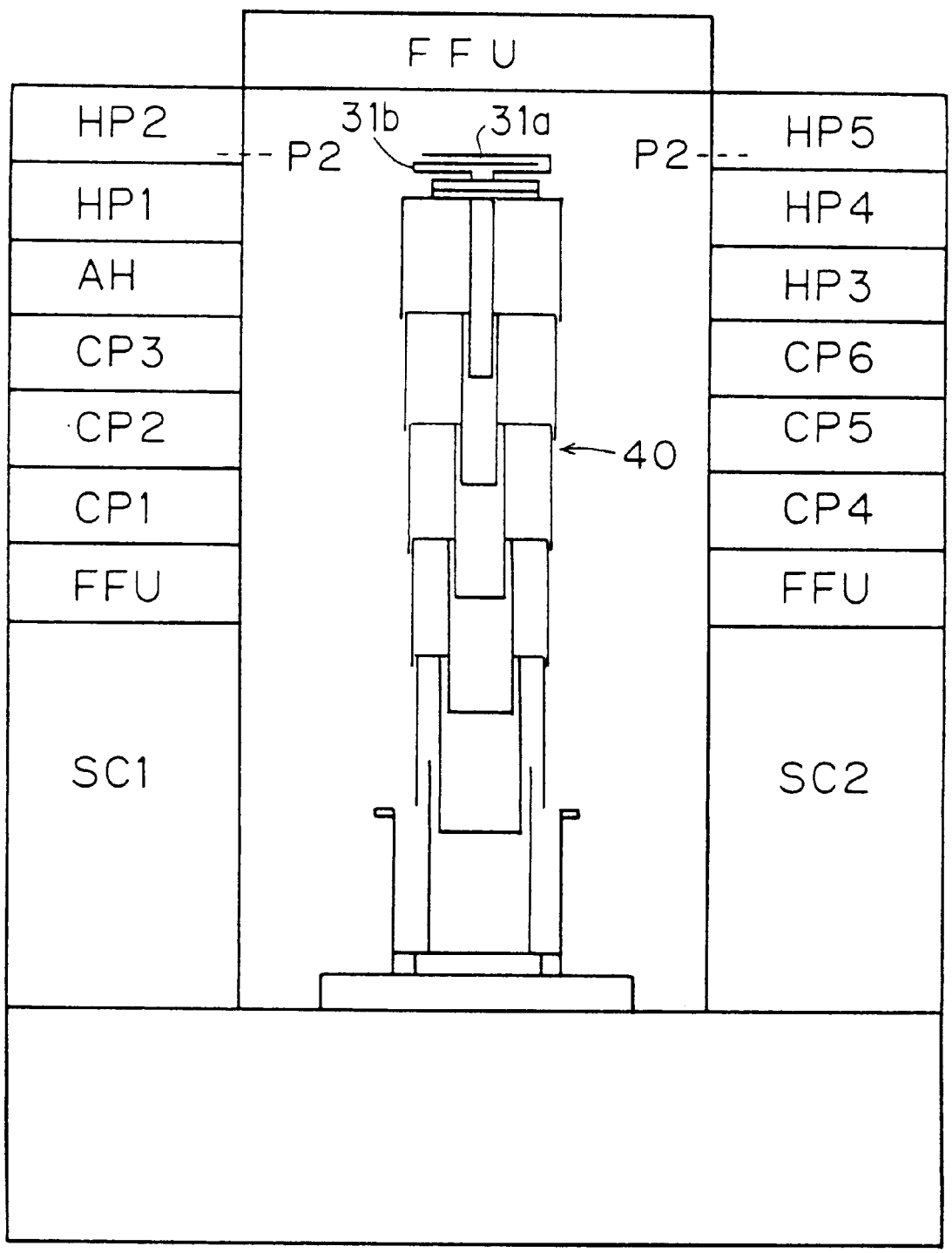
FIG. 11 illustrates the vertical movement of the transport robot of FIG. 3 when accessing a multi-tier thermal processing unit.

FIGS. 10 and 11 illustrate the vertical movement of the transport robot TR1. FIG. 10 shows the transport robot TR1 when accessing a liquid processing unit, and FIG. 11 shows the transport robot TR1 when accessing a multi-tier thermal processing unit 20.

Referring first to FIG. 10, when the transport robot TR1 accesses the liquid processing unit, a telescopic vertical movement mechanism 40 is placed in its retracted position, and is height-controlled so that the transport arms 31*a* and 31*b* transfer substrates to and from the liquid processing unit at a predetermined level P1. The transport arm 31*a* or 31*b* is inserted into the liquid processing unit to transfer a substrate to and from the liquid processing unit.

Next, referring to FIG. 11, when the transport robot TR1 accesses the multi-tier thermal processing unit 20, the telescopic vertical movement mechanism 40 is placed in its extended position. When the transport robot TR1 accesses a thermal processing unit positioned in the uppermost tier of the multi-tier thermal processing unit 20, the telescopic vertical movement mechanism 40 is height-controlled so that the transport arms 31a and 31b transfer substrates to and from the thermal processing unit at a predetermined level P2.

For access to any one of the liquid processing unit and the thermal processing unit, the transport arms 31a and 31b are rotated on the vertical axis by the rotative drive mechanism of the transport robot TR1 until they are opposed to the processing unit to be accessed, and are then moved forward and backward for transfer of the substrates. The rotative drive mechanism may be of a type which rotates almost all parts of the transport robot as shown in FIGS. 4 and 5 or of a type which rotates the stage on which the transport arms 31a and 31b are provided and the portions on the stage as shown in FIG. 9.

The substrate processing apparatus as above described which has an increased height because of the arrangement of the processing units vertically stacked in multiple tiers is divided into two sections, an upper section and a lower section, (for example, divided at an interface between the filter fan units FFU and the multi-tier thermal processing units 20) for separate transportation of the upper and lower sections. For the transportation, the telescopic vertical movement mechanism 40 may be placed in its completely retracted position to minimize the height of the transport robot TR1. Hence, if the height of the transport robot TR1 in this case is not greater than the freight height limit of transportation means, the transport robot TR1 is permitted to be transported while being installed on the lower section of the apparatus after the division, and is not required to be reassembled and adjusted.

Additionally, this preferred embodiment eliminates the problems encountered by the use of a pantograph structure, that is, the problems of the thickness of the pantograph links for increase in vertical stroke and the footprint when the transport robot is in its retracted position.

Therefore, the substrate processing apparatus to which the transport robot of this preferred embodiment is applied is capable of transporting a substrate to and from the processing portions and suppressing the footprint of the apparatus if the substrate processing apparatus is of an increased height, and also eliminates the need to reassemble and adjust the transport robot for transportation of the apparatus.

<5. Modifications>

The transport robot having the telescopic vertical movement mechanism as above described is applicable not only to the transport robot in the unit arrangement portion MP but also to other robots for transporting substrates.

Figure 12:
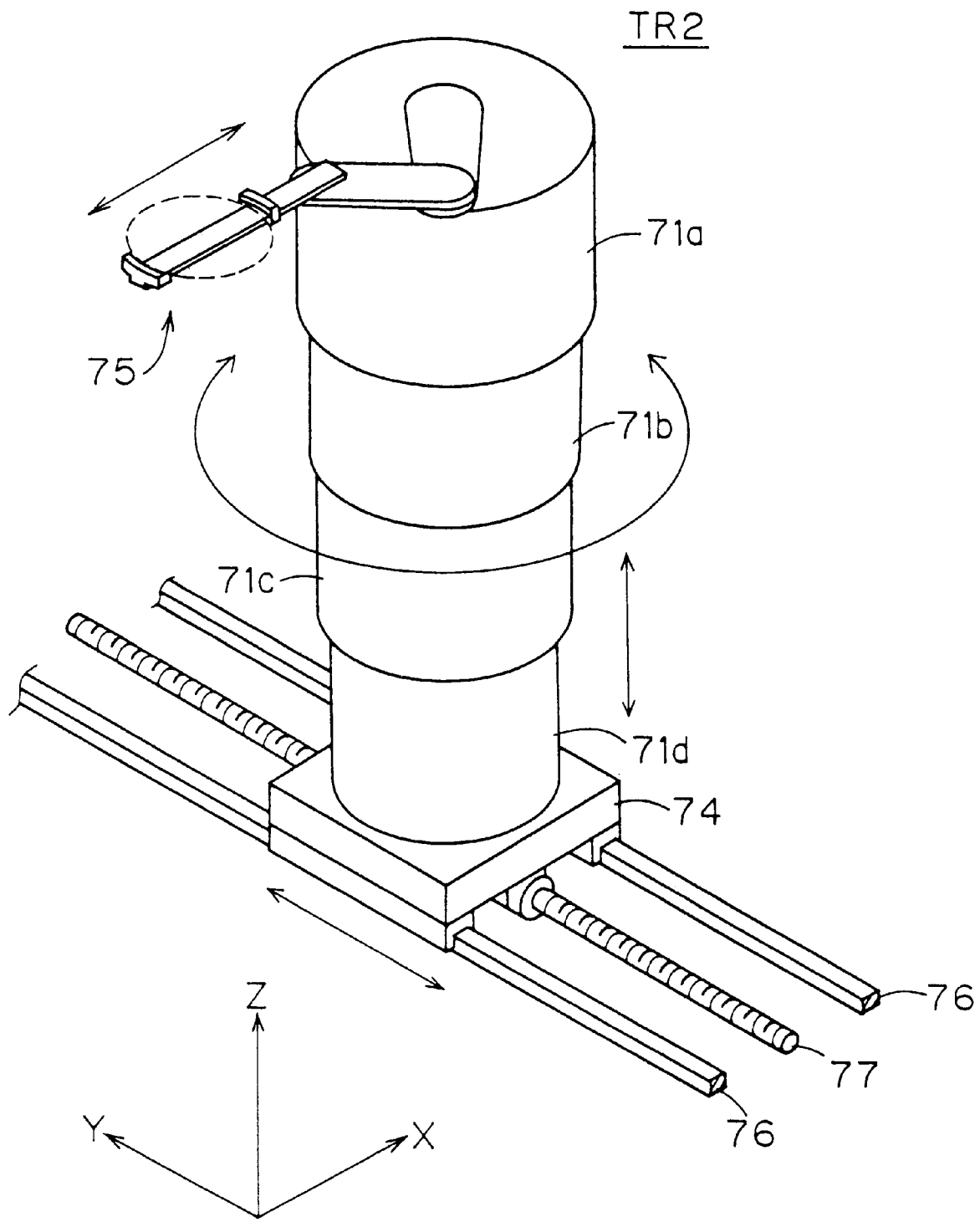
FIGS. 12 and 13 are perspective outside views of a transport robot of a substrate transport apparatus such as an indexer and an interface.
Figure 13:
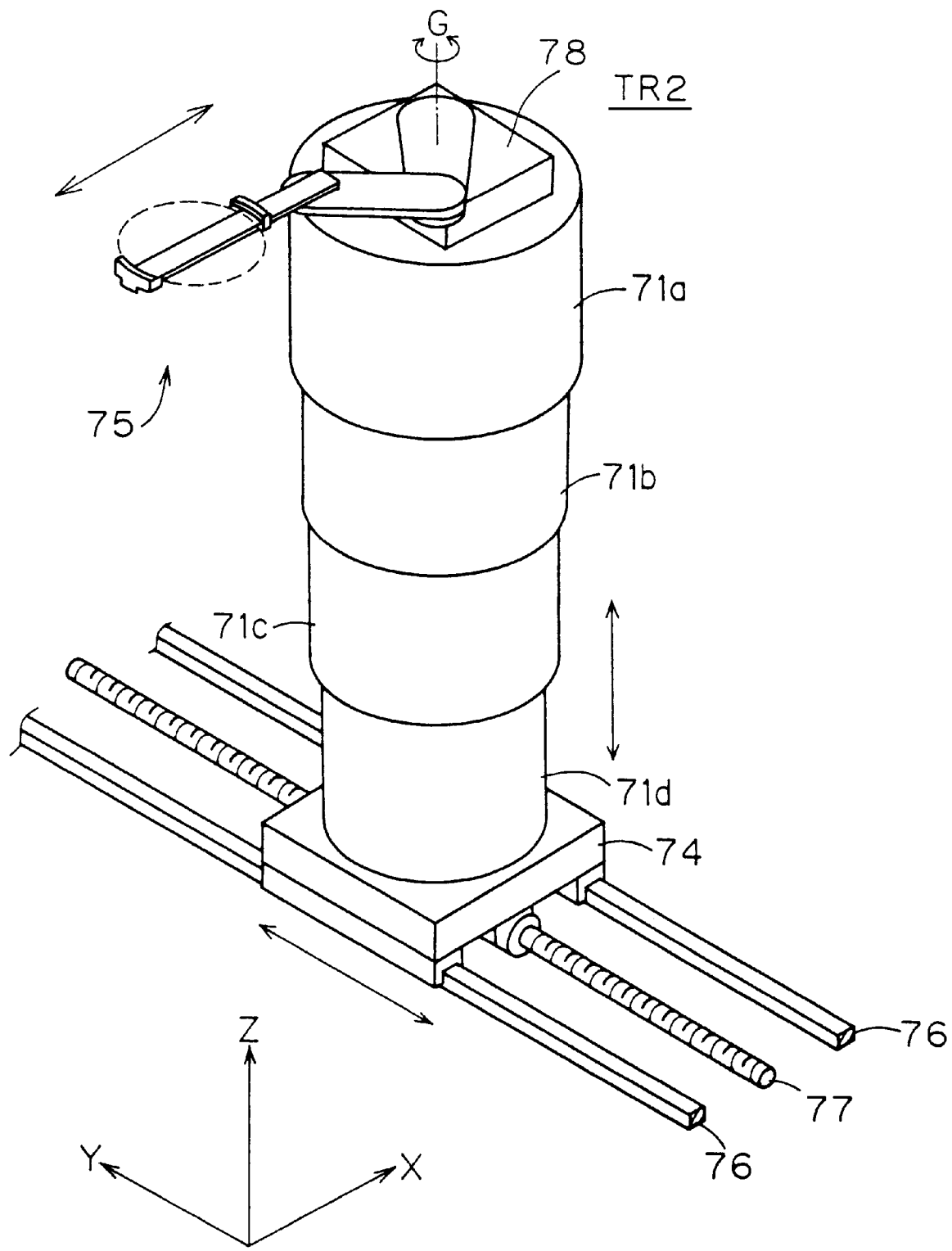

FIGS. 12 and 13 are schematic perspective views of a transfer robot TR2 for removing a substrate from a cassette in the indexer ID of FIG. 1 to transport the substrate to a predetermined transfer position wherein the substrate is transferred to the unit arrangement portion MP, and for receiving at the transfer position a substrate that has been subjected to a predetermined process in the unit arrangement portion MP to insert the processed substrate into the cassette. As shown in FIGS. 12 and 13, the transfer robot TR2 has a transport arm 75 permitted to move in positive and negative Y directions by a Y drive mechanism including an externally threaded screw 77 and a pair of guide rails 76 and serving as a mechanism for driving the transport arm 75 in the positive and negative Y directions.

The transport arm 75 is also permitted to move in positive and negative Z directions by a telescopic vertical movement mechanism provided on a base 74 and serving as a mechanism for driving the transport arm 75 in the positive and negative Z directions. This telescopic vertical movement mechanism is similar in construction to that of the transport robot TR1 in the unit arrangement portion MP. Specifically, the telescopic vertical movement mechanism is an extension/retraction mechanism of a telescopic type which is designed such that a cover 71a telescopically receives a cover 71b, the cover 71b telescopically receives a cover 71c, and the cover 71c telescopically receives a cover 71d. For downward movement of the transport arm 75, the covers 71a to 71d are sequentially nested. On the other hand, for upward movement of the transport arm 75, the covers 71a to 71d in a nested relationship are sequentially pulled out or extended. The transfer robot TR2 shown in FIG. 12 is adapted such that a rotative drive mechanism enables the telescopic vertical movement mechanism and the portions thereon to rotate on a vertical rotational axis. The transfer robot TR2 shown in FIG. 13 is adapted such that a drive mechanism provided inside a stage 78 enables the stage 78 on which the transport arm 75 is provided and the portions on the stage 78 to rotate on the vertical rotational axis G. The details of the telescopic vertical movement mechanism and the rotative drive mechanism of FIGS. 12 and 13 are similar to those described with reference to FIGS. 4, 5 and 9, and the description thereof will be dispensed with herein. Thus, the telescopic vertical movement mechanism of the telescopically nestable multitier construction may be achieved also in the transfer robot TR2 of the indexer ID.

Also, the transport arm 75 may be folded and unfolded to transport a substrate in the horizontal direction. This operation of the transport arm 75 is also similar to that described with reference to FIGS. 7 and 8.

Figure 14:
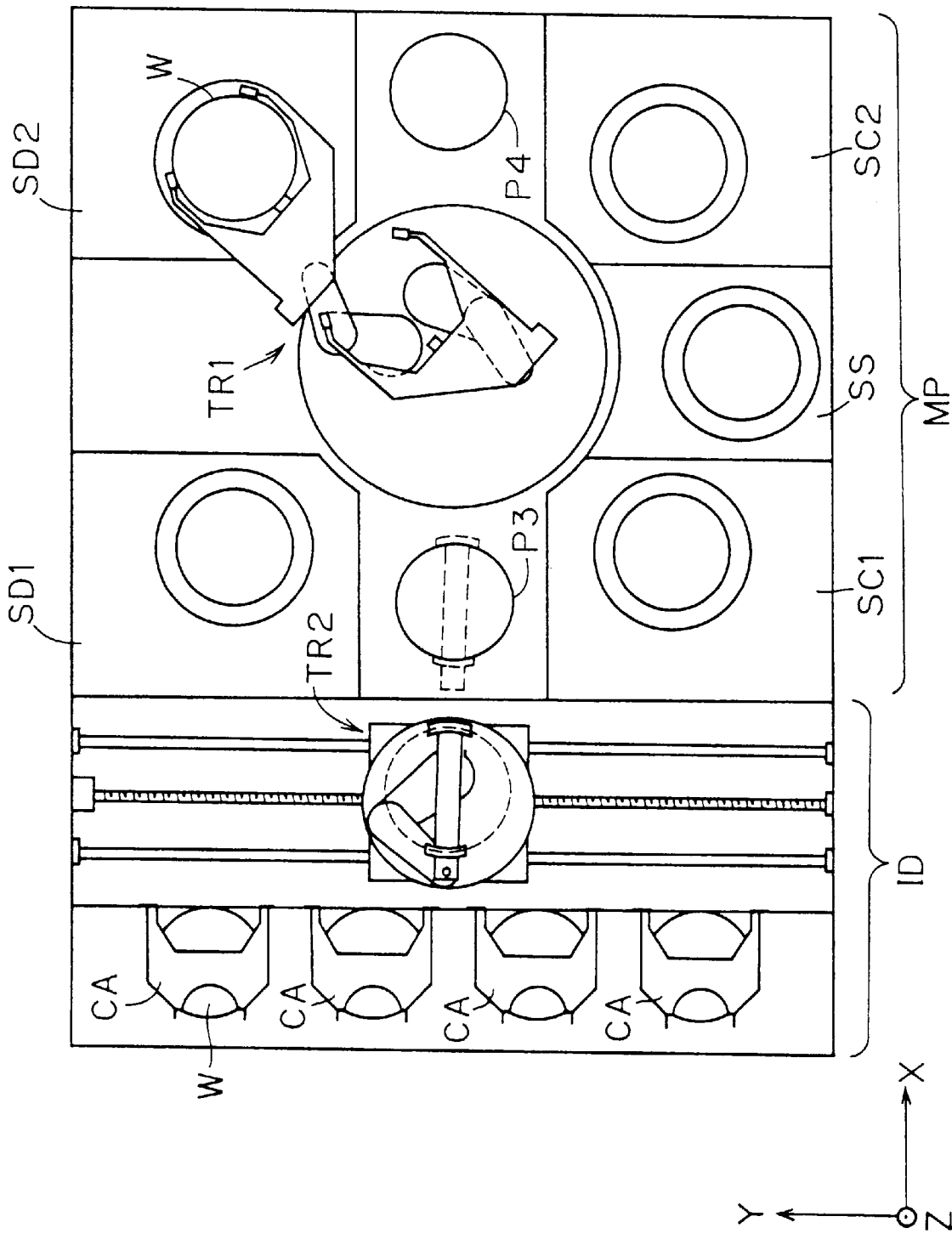
FIG. 14 illustrates the transfer of a substrate between the indexer and the unit arrangement portion.

The transfer operation of a substrate in the indexer ID with the transfer robot TR2 mounted therein and the unit arrangement portion MP with the transport robot TR1 mounted therein will be described below. FIG. 14 illustrates the transport of a substrate W in the unit arrangement portion MP, the transport of a substrate in the indexer DD, and the transfer of a substrate between the unit arrangement portion MP and the indexer ID.

The transfer robot TR2 in the indexer ID transfers a substrate to and from the transport robot TR1 of the unit arrangement portion MP. The transfer robot TR2 receives the substrate W transported to a transfer position P3 by the transport robot TR1 of the unit arrangement portion MP to insert the substrate W into a cassette CA, and removes the substrate W in the cassette CA from the cassette CA and then moves to the transfer position P3 to transfer the substrate W to the transport robot TR1. That is, the transfer robot TR2 is reciprocatingly movable along the Y axis on a passage provided in the indexer ID as a whole. In the position shown in FIG. 14, the transfer robot TR2 moves the transport arm thereof which holds the substrate along the Z and X axes to transfer the substrate W to and from the transport robot TR1 in front of the transfer robot TR2. On the other hand, as the transfer robot TR2 moves in the positive and negative Y directions from the position shown in FIG. 14 and rotates until it is opposed to the front of any cassette CA, the transport arm of the transfer robot TR2 moves in the positive and negative Z direction and in the negative X direction to transfer the substrate W to and from the cassette CA.

The transport robot TR1 provided centrally of the unit arrangement portion MP transfers the substrate W received from the transfer robot TR2 at the transfer position P3 to one of the surrounding processing units.

The transport robot TR1 transfers a substrate at the transfer position P3 to and from the indexer ID, and transfers a substrate at a transfer position P4 to and from the interface IF. More specifically, the transport robot TR1 moves the substrate W which has been subjected to a predetermined process in the unit arrangement portion MP to the transfer position P4 to transfer the substrate to the interface IF at the transfer position P4. Also, the transport robot TR1 moves the substrate W which has been subjected to all processes to the transfer position P3 to transfer the substrate to the indexer ID at the transfer position P3.

The interface IF provided for transporting a substrate between the exposure apparatus and the unit arrangement portion MP as described above also comprises a transport robot for receiving a substrate from the exposure apparatus to transport the substrate to the transfer position P4 in the unit arrangement portion MP and for receiving a substrate from the transfer position P4 to transport the substrate to the exposure apparatus. The similar construction of the transfer robot TR2 of the indexer ID shown in FIGS. 12 and 13 may be applied to the transport robot in the interface IF.

In other words, the transport robot having the telescopic vertical movement mechanism described in this preferred embodiment may be applied to a transfer portion, such as the indexer ID and the interface IF, for transporting a substrate to and from the unit arrangement portion MP. In such a case, it is preferable that the substrate transport apparatus comprises a mechanism including the externally threaded screw 77 and the pair of guide rails 76 as shown in FIG. 12 or 13 for driving the transport robot along the Y axis.

While the invention has been described in detail, the foregoing description is in all aspects illustrative and not restrictive. It is understood that numerous other modifications and variations can be devised without departing from the scope of the invention.

We claim:

1. An apparatus for processing a substrate, comprising:
   a transport mechanism for transporting a substrate; and
   a plurality of vertically stacked processing parts arranged to surround said transport mechanism, each of said processing parts being operable to process said substrate, said transport mechanism comprising:
      a plurality of arms each comprised of a plurality of arm-segments mutually linked and capable of being bent and straightened to deliver said substrate to said plurality of processing parts; and
      a supporting mechanism for supporting said plurality of arms, said supporting mechanism comprising:
         a telescopic elevator having said plurality of arms mounted at the upper end thereof for elevating and lowering said plurality of arms, wherein said plurality of arms are capable to operate at the upper end of said telescopic elevator without mutual interference among said plurality of arms; and
         an actuator mechanism at the upper end of the telescopic elevator coupled to said plurality of arms, and operative to move said plurality of arms both linearly and rotationally in a horizontal plane without rotation of the entire supporting mechanism.

2. The apparatus of claim 1, wherein said actuator mechanism comprises:
   a push-pull mechanism which extends and retracts said arms in a horizontal plane, and a rotational mechanism which rotates said push-pull mechanism and said arms around a vertical axis.

3. The apparatus of claim 2, wherein said plurality of vertically stacked processing parts are sectioned into a first layer and a second layer located above said first layer, and
   each of said plurality of vertically stacked processing parts comprises:
      a wet processing unit arranged in said first layer for processing said substrate with a processing liquid, and
      at least one thermal processing unit being arranged in said second layer for applying thermal processing to said substrate.

4. The apparatus of claim 3, wherein said supporting mechanism further comprises:
   a telescopic cover mechanism vertically extendable and retractable in response to extension and retraction of said telescopic elevator while covering said telescopic elevator.

5. An apparatus for processing a substrate, comprising:
   a transport mechanism for transporting a substrate; and
   a plurality of vertically stacked processing parts arranged to surround said transport mechanism,
   wherein each of said processing parts comprises
      a wet processing unit arranged in said first layer for processing said substrate with a processing liquid, and
      at least one thermal processing unit being arranged in said second layer for applying thermal processing to said substrate; and
   wherein said transport mechanism comprises:
      an arm for holding said substrate and operable to deliver said substrate to said plurality of processing parts; and
      a supporting mechanism for supporting said plurality of arms, said supporting mechanism comprising:
         a telescopic elevator having the arm mounted at the upper end thereof for elevating and lowering said arm;
         a push-pull mechanism at the upper end of the telescopic elevator coupled to said arm that extends and retracts said arm in a horizontal plane;
         a rotational mechanism that rotates said push-pull mechanism and said arm around a vertical axis, thereby rotating said arm both linearly and rotationally in a horizontal plane without rotation of the entire supporting mechanism; and,
      a plurality of telescopic cover elements whose respective diameters are increased towards the top of said telescopic cover mechanism, vertically extendible and retractable in response to extension and retraction of said telescopic elevator while covering said telescopic elevator.

6. The apparatus of claim 5, wherein
   said telescopic cover mechanism further comprises:
      b-3) a cover mechanism for covering said telescopic elevator, comprising:
         a first cover member for covering a first part of said telescopic elevator, and
         a second cover member for covering a second part of said telescopic elevator,
            wherein said first cover member is inserted into said second cover member in response to retraction of said telescopic elevator and is withdrawn from said second cover member in response to extension of said telescopic elevator.

7. The apparatus of claim 6, wherein
said telescopic cover mechanism further comprises:
   a third telescopic element which is inserted into said second telescopic element to lower said arm, and is withdrawn from said second telescopic element to elevate said arm,
   said first and third telescopic elements are connected to each other by a wire, and
   said wire is hooked on a pulley provided on said second telescopic element.

8. The apparatus of claim 7, wherein
said telescopic cover mechanism further comprises:
   a third cover member for covering a third part of said telescopic elevator,
   said second cover member is inserted into said third cover member in response to retraction of said telescopic elevator and is withdrawn from said third cover member in response to extension of said telescopic elevator, and
   said first to third cover members are fixed to said first to third telescopic elements, respectively.

* * * * *